(12) United States Patent
Huang et al.

(10) Patent No.: US 8,808,492 B2
(45) Date of Patent: Aug. 19, 2014

(54) METHOD OF JOINING SUPERCONDUCTOR MATERIALS

(75) Inventors: Kun-Ping Huang, Miaoli County (TW);
Chih-Chen Chang, New Taipei (TW);
Yu-Tse Hsieh, Taoyuan County (TW);
Chih-Wei Luo, Hsinchu (TW);
Chih-Hsiang Su, New Taipei (TW);
Wen-Yen Tzeng, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 119 days.

(21) Appl. No.: 13/490,429

(22) Filed: Jun. 6, 2012

(65) Prior Publication Data
US 2013/0157868 A1 Jun. 20, 2013

(30) Foreign Application Priority Data
Dec. 20, 2011 (TW) .............................. 100147425 A

(51) Int. Cl.
*H01L 39/24* (2006.01)

(52) U.S. Cl.
USPC ..................................................... 156/272.2

(58) Field of Classification Search
USPC .............................. 156/272.2, 273.9; 505/480
See application file for complete search history.

(56) References Cited

U.S. PATENT DOCUMENTS

| | | | |
|---|---|---|---|
| 5,081,074 A | 1/1992 | Murayama et al. | |
| 6,531,233 B1 | 3/2003 | Pourrahimi et al. | |
| 6,561,412 B2 | 5/2003 | Maeda et al. | |
| 7,071,148 B1 | 7/2006 | Selvamanickam et al. | |
| 2003/0148891 A1* | 8/2003 | Iida et al. ...................... | 505/100 |
| 2008/0258359 A1 | 10/2008 | Zhamu et al. | |

FOREIGN PATENT DOCUMENTS

| | | | |
|---|---|---|---|
| JP | 5-186219 | | 7/1993 |
| JP | 6-96828 | | 4/1994 |
| JP | 06096828 A | * | 4/1994 |
| JP | 07-263768 | | 10/1995 |
| JP | 2003-206134 | | 7/2003 |
| JP | 2003-260585 | | 9/2003 |
| JP | 2007-12582 | | 1/2007 |
| JP | 2008-296260 | | 12/2008 |
| JP | 2008296260 A | * | 12/2008 |
| TW | 163472 | | 7/1991 |

OTHER PUBLICATIONS

Chang et al, "Joint Characteristics of YBCO Coated Conductor by Removing a Metallic Stabilizer," IEEE Transactions on Applied Superconductivity 18 (2), Jun. 2008, pp. 1220-1223.

(Continued)

*Primary Examiner* — Daniel McNally
(74) *Attorney, Agent, or Firm* — Jianq Chyun IP Office

(57) ABSTRACT

A method of joining superconductor materials is described. A microwave chamber including a first heat absorption plate and a second heat absorption plate corresponding to the first absorption plate is provided. A first superconductor material and a second superconductor material are disposed between the first heat absorption plate and the second heat absorption plate in the microwave chamber. The first superconductor material and the second superconductor material have an overlapping region therebetween, and a pressure is applied to the first heat absorption plate and the second heat absorption plate. Microwave power is supplied to the microwave chamber. The first heat absorption plate and the second heat absorption plate transform the microwave power into thermal energy so as to join the first superconductor material and the second superconductor material at the overlapping region.

8 Claims, 5 Drawing Sheets

(56) References Cited

OTHER PUBLICATIONS

Yoshioka et al., "Low resistance joint of the YBCO coated conductor," Journal of Physics; Conference series 43, 2006, pp. 166-169.

Kato et al., "Diffusion joint of YBCO coated conductors using stabilizing silver layers," Physica C, 2006, pp. 686-688.

Park et al., "Analysis of a Joint Method Between Superconducting YBCO Coated Conductors," IEEE Transactions on Applied Superconductivity 17 (2), Jun. 2007, pp. 3266-3269.

"Office Action of Korean Counterpart Application" with English translation thereof, issued on Sep. 17, 2013, p. 1-p. 5.

"Office Action of Japan Counterpart Application", issued on Oct. 22, 2013, p. 1-p. 4.

* cited by examiner

METHOD OF JOINING SUPERCONDUCTOR MATERIALS

CROSS-REFERENCE TO RELATED APPLICATION

This application claims the priority benefit of Taiwan application serial no. 100147425, filed on Dec. 20, 2011. The entirety of the above-mentioned patent application is hereby incorporated by reference herein and made a part of this specification.

BACKGROUND

1. Technical Field

The disclosure relates to a joining method, and in particular, to a method of joining superconductor materials.

2. Related Art

Based on the current industrial technologies, superconductor materials are joined by using copper metal as an assistant joining material. However, by using the joining type, a produced high-temperature superconductive lead of yttrium barium copper oxide (YBCO) can merely have a maximum length of 500 meters. If the length of the superconductive lead is further extended, the performance of a superconductive product thereof is affected after being used for a long time. The main reason is that although the resistance value of the copper metal that is used to join superconductor materials is not high, the copper metal has a certain resistance value after all. Therefore, heat may be inevitably generated during a long time of running to cause the consumption of energy, even make the superconductive lead lose its conductivity. Hence, the whole quality of the superconductive transmission line is affected.

Apart from this, high-temperature superconductor materials are almost in a complex structure of ceramic oxide materials. For the bonding between conventional ceramic materials, a fluxing agent may be used to lower a bonding temperature of ceramic (lower than a sintering temperature thereof). However, although the ceramic can be bonded together, the interface structure is changed, and thus is incapable of being the same as that of the origin material. Therefore, a rather large resistance value definitely exists on the bonding interface.

SUMMARY

The disclosure aims to provide a method of joining superconductor materials, which can solve the problems of resistance value and other issues incurred in the conventional joining methods In the method, a microwave chamber is provided. The microwave chamber has a first heat absorption plate and a second heat absorption plate corresponding to the first heat absorption plate. A first superconductor material and a second superconductor material are disposed between the first heat absorption plate and the second heat absorption plate in the microwave chamber. The first superconductor material and the second superconductor material have an overlapping region therebetween. A pressure is applied to the first heat absorption plate and the second heat absorption plate. Microwave power is supplied to the microwave chamber. The first heat absorption plate and the second heat absorption plate transform the microwave power into thermal energy so as to join the first superconductor material and the second superconductor material at the overlapping region.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
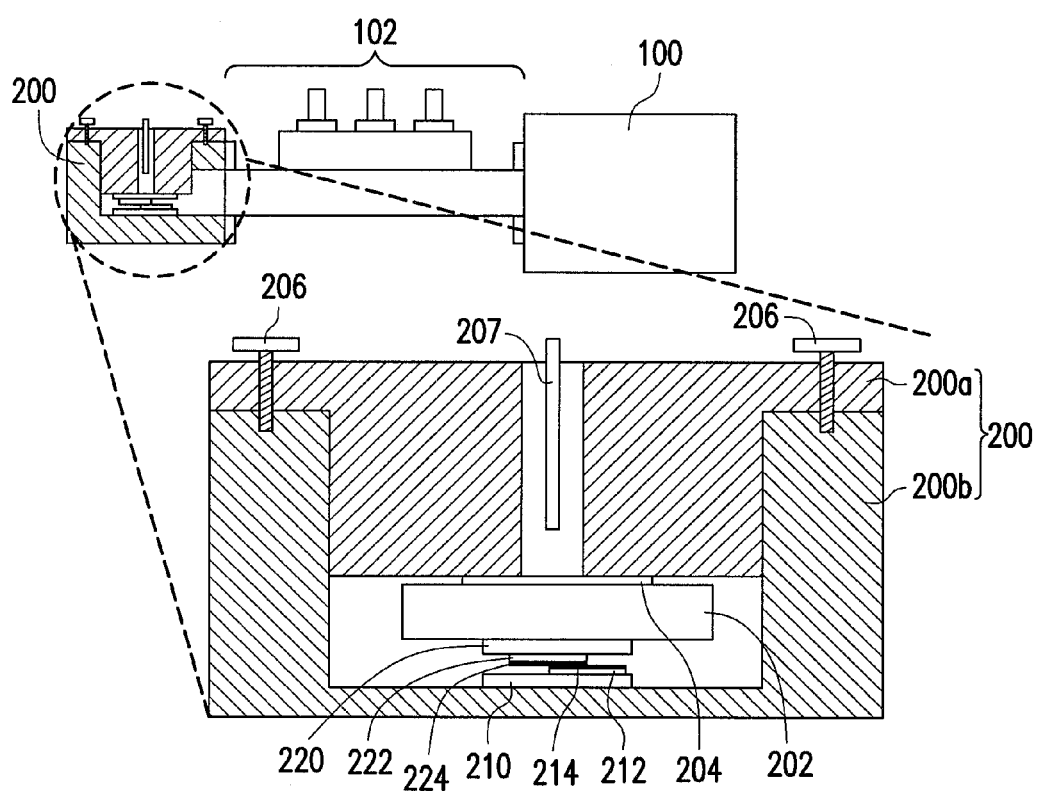
FIG. 1 is a schematic diagram of a method of joining superconductor materials according to an exemplary embodiment of the disclosure.

FIG. 1 is a schematic diagram of a method of joining superconductor materials according to an exemplary embodiment of the disclosure. Referring to FIG. 1, first a microwave chamber 200 is provided. Additionally, the microwave chamber 200 is connected to a microwave generator 100 through a waveguide device 102. The microwave generator 100 can generate microwave power with different levels. The generated microwave power enters the microwave chamber 200 through the waveguide device 102, and may generate a resonance and focusing effect in the microwave chamber 200.

In this exemplary embodiment, the microwave chamber 200 is a closed space formed of an upper structure 200a and a lower structure 200b. Additionally, a first heat absorption plate 210 and a second heat absorption plate 220 are disposed in the microwave chamber 200. The first heat absorption plate 210 and the second heat absorption plate 220 are made of a plate material capable of absorbing the microwave power and rapidly transforming the microwave power into thermal energy. For example, the first heat absorption plate 210 and the second heat absorption plate 220 may include silicon carbide (SiC), graphite, active charcoal, or other materials that may absorb microwave power well. Additionally, the microwave chamber 200 may further include an O-shaped ring 204, a quartz plate 202, screws 206, a temperature sensor 207, and other components. The architecture and components of the microwave chamber 200 are not limited by the disclosure.

The process of joining superconductor materials by using the aforementioned microwave chamber 200 is described below. First, a first superconductor material 214 and a second superconductor material 224 are clamped between the first heat absorption plate 210 and the second heat absorption plate 220 in the microwave chamber 200. According to this exemplary embodiment, the first superconductor material 214 and the second superconductor material 224 are the same superconductor material. However, the disclosure is not limited thereto. In other embodiments, the first superconductor material 214 and the second superconductor material 224 may be different superconductor materials. Here, the first superconductor material 214 and the second superconductor material 224 separately include a superconductor material such as a yttrium barium copper oxide compound ($YBa_2Cu_3O_{7-\delta}$, YBCO), or a doped yttrium barium copper oxide compound ($YBa_2Cu_{3-x}M_xO_{7-\delta}$ or $Y_{1-x}N_xBa_2Cu_3O_{7-\delta}$). Here M represents Zn, Li, Ni or Zr, N represents Ca, Zr, La, Ce, Pr, Nd, Pm, Sm, Eu, Gd, Tb, Dy, Ho, Er, Tm, Yb or Lu, and δ represents 0~1. The superconductor material may also be $Bi_2Sr_2Ca_2Cu_3O_{10}$ (BSCCO), $Tl_2Ba_2Ca_2Cu_3O_{10}$ (TBCCO), or $Hg_{12}Tl_3Ba_{30}Ca_{30}Cu_{45}O_{127}$ (HBCCO). Apart from this, the thickness of the first superconductor material 214 and the second superconductor material 224 ranges from 0.1 to 5 μm.

Additionally, in this exemplary embodiment, the first superconductor material 214 is carried on a first substrate 212, and the second superconductor material 224 is carried on a second substrate 222. The first superconductor material 214 can be formed on the first substrate 212 by an evaporation process, an ion-beam-assisted deposition process, a metal organic chemical vapor deposition process, or a pulsed laser deposition process. The second superconductor material 224 can be formed on the second substrate 222 by an evaporation process, an ion-beam-assisted deposition process, a metal organic chemical vapor deposition process, or a pulsed laser deposition process. Generally speaking, the selection of the material of the first substrate 212 is related to that of the first superconductor material 214, and the selection of the material of the second substrate 222 is related to that of the second superconductor material 224. Here, the first substrate 212 and the second substrate 222 are respectively a Strontium Titanate (STO) substrate and a Lanthanum Aluminate (LAO) substrate.

Figure 3:
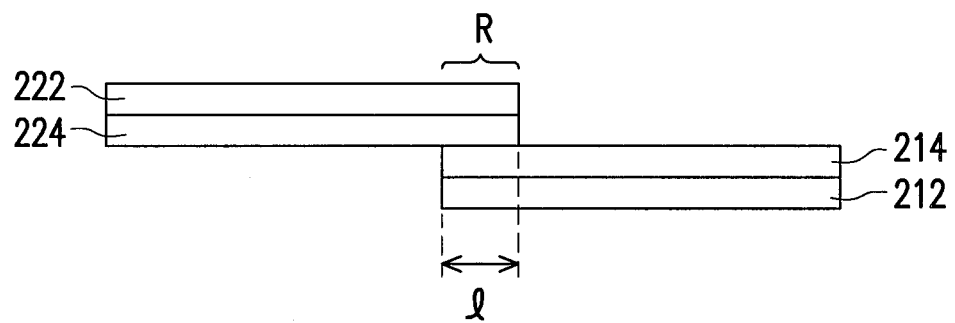
FIG. 3 is a schematic diagram of the joining of a first superconductor material and a second superconductor material in FIG. 1.

Based on the aforementioned, the first superconductor material 214 and the second superconductor material 224 clamped between the first heat absorption plate 210 and the second heat absorption plate 220 has an overlapping region R therebetween, as shown in FIG. 3. According to this exemplary embodiment, the length l of the overlapping region R between the first superconductor material 214 and the second superconductor material 224 is larger than or equal to 0.5 cm, exemplarily 0.5 cm.

Subsequently, referring to FIG. 1, microwave power is generated by using the microwave generator 100. The generated microwave power is transmitted to the microwave chamber 200. According to this exemplary embodiment, the microwave power is approximately 500 W. The time for supplying the microwave power to the microwave chamber 200 is approximately 1 minute. Additionally, the pressure in the microwave chamber 200 may be an atmospheric pressure. In this exemplary embodiment, when the microwave power is supplied to the microwave chamber 200, a pressure that is larger than 1000 kg/m$^2$ may be further supplied, through the screws 206, to the first superconductor material 214 and the second superconductor material 224 between the first heat absorption plate 210 and the second heat absorption plate 220. In other words, if the screws 206 are locked downwards, the pressure that is applied to the first heat absorption plate 210 and the second heat absorption plate 220 becomes larger. On the contrary, if the screws 206 are moved upwards, the pressure that is applied to the first heat absorption plate 210 and the second heat absorption plate 220 becomes smaller. Here, the pressure is smaller than a pressure that may break or damage the first superconductor material 214 and the second superconductor material 224.

After the microwave power is transmitted to the microwave chamber 200, the first heat absorption plate 210 and the second heat absorption plate 220 absorb the microwave power and rapidly transform the microwave power into thermal energy. At this time, the first heat absorption plate 210 and the second heat absorption plate 220 may transmit the thermal energy respectively to the first superconductor material 214 and the second superconductor material 224 so as to heat the first superconductor material 214 and the second superconductor material 224 to a temperature between about 790° C. and 830° C. Additionally, in this exemplary embodiment, the temperature in the microwave chamber 200 or the temperature of the quartz plate 202 may be measured by the temperature sensor 207 so as to make sure that the first superconductor material 214 and the second superconductor material 224 are heated to a predetermined temperature. In other words, by using the aforementioned microwave heating method in combination with selectively supplying a pressure, the first superconductor material 214 and the second superconductor material 224 are joined at the overlapping region R. Subsequently, when being cooled to the room temperature, the first superconductor material 214 and the second superconductor material 224 are wholly joined together.

In this exemplary embodiment, the first superconductor material 214 and the second superconductor material 224 are joined without using any other melting and bonding material. Instead, the first superconductor material 214 and the second superconductor material 224 are directly bonded or joined with each other through the microwave heating method. Therefore, the exemplary embodiment does not have the problem that a joining interface resistance value would cause and further affects the efficacy of a superconductive device. Additionally, the microwave heating process of this exemplary embodiment is not required to be performed in a vacuum condition. The joining can be implemented within a short time. Therefore, the joining method of this exemplary embodiment has a low cost and a fast speed.

Figure 2:
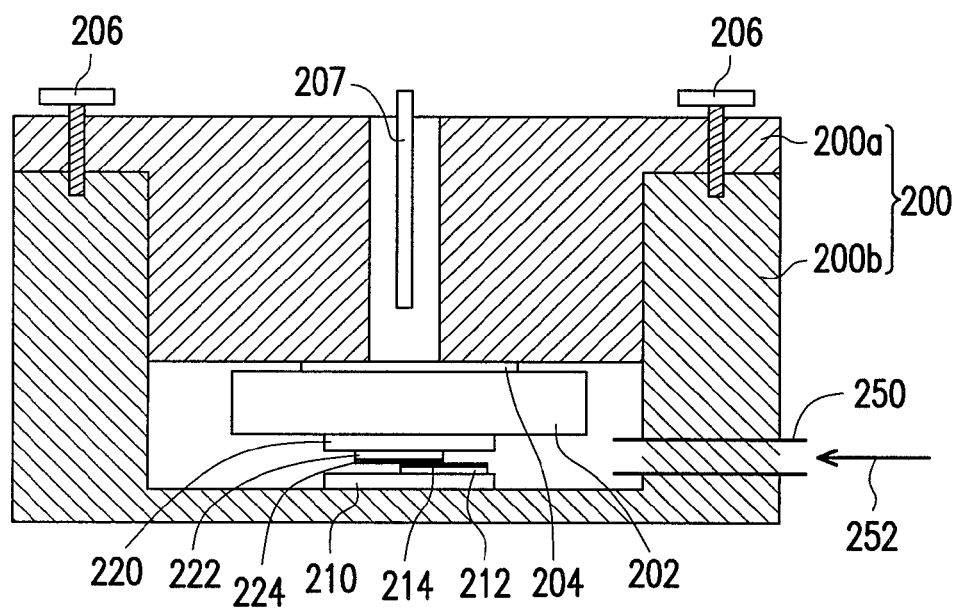
FIG. 2 is a schematic diagram of a method of joining superconductor materials according to another exemplary embodiment of the disclosure.

FIG. 2 is a schematic diagram of a method of joining superconductor materials according to another exemplary embodiment of the disclosure. The exemplary embodiment of FIG. 2 is similar to that of FIG. 1, so the same element is indicated with the same symbol, which is not repeated again. Referring to FIG. 2, the microwave chamber 200 of this exemplary embodiment further includes a gas inlet device 250. In other words, when the microwave power is supplied to the microwave chamber 200 to join the first superconductor material 214 and the second superconductor material 224, oxygen gas 252 may be further let into the microwave chamber 200 through the gas inlet device 250. Here, the oxygen flow rate ranges from 0 to 10000 sccm, exemplarily 300 sccm.

By letting oxygen in the microwave chamber 200, the oxygen gas consumed during the microwave heating process is supplemented. When the microwave chamber 200 has sufficient oxygen gas, the joining process by microwave heating of the first superconductor material 214 and the second superconductor material 224 is assured of enough oxygen supply and the joining quality is ensured.

In the aforementioned exemplary embodiment, an example of joining the first superconductor material 214 and the second superconductor material 224 is taken so that persons skilled in the art may clearly understand the disclosure.

Based on the aforementioned, in the exemplary embodiment, a plurality of superconductor materials are directly bonded or joined with each other at the same time through the microwave heating method, so as to form a long lead. Therefore, the exemplary embodiment does not have the problem that a joining interface resistance value would cause and further affects the efficacy of a superconductive device. Apart from this, in this exemplary embodiment, the superconductor materials are directly bonded or joined with each other without any other joining material, therefore they can maintain the superconductivity at zero resistance value.

Figure 4:
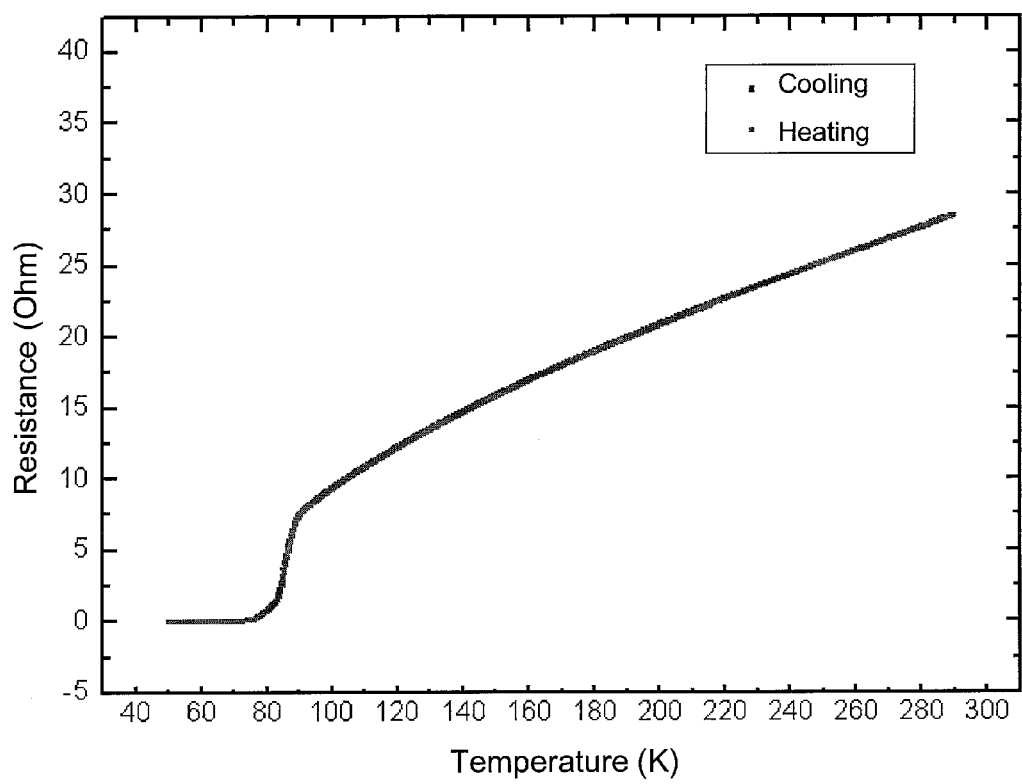
FIG. 4 is a diagram of the relation between the temperature and the resistance of a superconductor material after being joined according to an exemplary embodiment of the disclosure.
Figure 5:
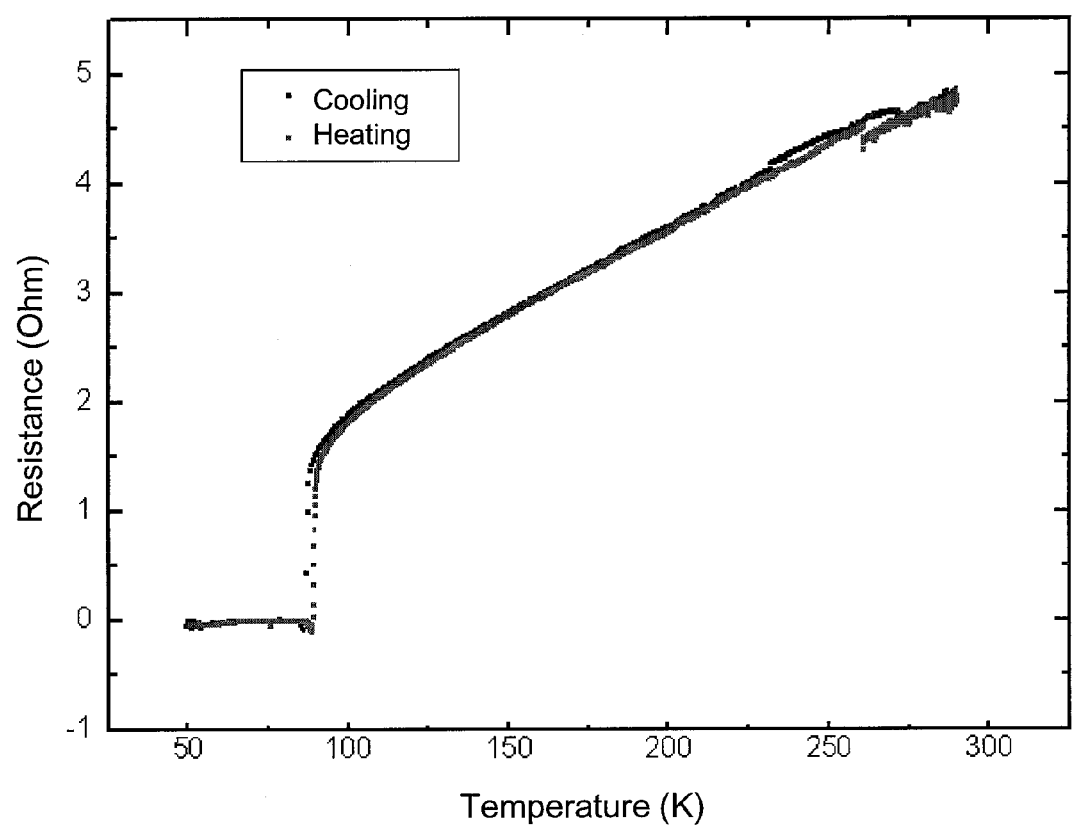
FIG. 5 is a diagram of the relation between the temperature and the resistance of a superconductor material after being joined according to another exemplary embodiment of the disclosure.

FIG. 4 is a diagram of the relation between the resistance and the temperature of a superconductor material after being joined according to an exemplary embodiment of the disclosure. Referring to FIG. 4, a YBCO superconductor material is adopted in FIG. 4. The microwave heating condition for the YBCO superconductor material includes that microwave power is 500 W and the time of the microwave heating is 1 minute. It can be learned from FIG. 4 that a critical temperature (Tc) of the joined YBCO superconductor material may still be kept at 80 K. Generally speaking, a superconductor material having a critical temperature (Tc) higher than 77 K may be a potential and valuable material as a low cost application FIG. 5 is a diagram of the relation between the resistance and the temperature of a superconductor material after being joined according to another exemplary embodiment of the disclosure. Referring to FIG. 5, a YBCO superconductor material is adopted in FIG. 5. The microwave heating condition thereof includes that microwave power is 500 W and the time of the microwave heating is 1 minute. Additionally, oxygen is let in during the process of microwave heating. The amount of the let-in oxygen is 300 sccm. In the exemplary embodiment of FIG. 5, the critical temperature (Tc) of the joined YBCO superconductor material may be increased to 85 K.

Based on the aforementioned, in the disclosure, superconductor materials are joined by using a microwave heating method. Since the joining method in the disclosure does not use any other material as an interface joining material, the problem that exists in the joining of conventional methods that apply other materials, result in resistance derivation of an interface or joining material, no longer occurs. Additionally, in the disclosure, the structure that is formed by joining superconductor materials with the microwave heating method still has properties of high-temperature superconductivity.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of joining superconductor materials, comprising:

providing a microwave chamber, wherein the microwave chamber comprises a first heat absorption plate and a second heat absorption plate corresponding to the first heat absorption plate, wherein the first heat absorption plate and the second heat absorption plate respectively comprise silicon carbide (SiC);

disposing a first substrate carrying a first superconductor material and a second substrate carrying a second superconductor material between the first heat absorption plate and the second heat absorption plate in the microwave chamber, wherein the first superconductor material and the second superconductor material have an overlapping region therebetween, the first heat absorption plate is directly in contact with the first substrate and the second heat absorption plate is directly in contact with the second substrate, the first substrate conducts heat from the first heat absorption plate to the first superconductor material and the second substrate conducts heat from the second heat absorption plate to the second superconductor material, and a pressure is applied to the first heat absorption plate and the second heat absorption plate; and supplying microwave power to the microwave chamber, wherein the first heat absorption plate and the second heat absorption plate transform the microwave power into thermal energy so as to join the first superconductor material and the second superconductor material at the overlapping region.

2. The method of joining superconductor materials according to claim 1, further comprising flowing oxygen gas into the microwave chamber.

3. The method of joining superconductor materials according to claim 2, wherein the flow rate of the oxygen gas ranges from 0 to 10000 sccm.

4. The method of joining superconductor materials according to claim 1, wherein the first superconductor material and the second superconductor material respectively comprise a yttrium barium copper oxide compound ($YBa_2Cu_3O_{7-\delta}$, YBCO), a doped yttrium barium copper oxide compound ($YBa_2Cu_{3-x}M_xO_{7-\delta}$ or $Y_{1-x}N_xBa_2Cu_3O_{7-\delta}$) where M represents Zn, Li, Ni or Zr and N represents Ca, Zr, La, Ce, Pr, Nd, Pm, Sm, Eu, Gd, Tb, Dy, Ho, Er, Tm, Yb or Lu and $\delta$ represents 0~1, $Bi_2Sr_2Ca_2Cu_3O_{10}$ (BSCCO), $Tl_2Ba_2Ca_2Cu_3O_{10}$ (TBCCO), or $Hg_{12}Tl_3Ba_{30}Ca_{30}Cu_{45}O_{127}$ (HBCCO).

5. The method of joining superconductor materials according to claim 1, wherein a thickness of the first superconductor material and a thickness of the second superconductor material respectively range from 0.1 to 5 μm.

6. The method of joining superconductor materials according to claim 1, wherein a length of the overlapping region between the first superconductor material and the second superconductor material is larger than or equal to 0.5 cm.

7. The method of joining superconductor materials according to claim 1, wherein the pressure is larger than 1000 kg/m².

8. The method of joining superconductor materials according to claim 1, wherein the first heat absorption plate completely covers the first substrate and the second heat absorption plate completely covers the second substrate.

* * * * *